(12) United States Patent
Shiue et al.

(10) Patent No.: US 8,378,223 B1
(45) Date of Patent: Feb. 19, 2013

(54) DELAY LINE STRUCTURE

(75) Inventors: Guang-Hwa Shiue, Chung Li (TW); Jia-Hung Shiu, Chung Li (TW)

(73) Assignee: Chung Yuan Christian University, Chung Li (TW)

( * ) Notice: Subject to any disclaimer, the term of this patent is extended or adjusted under 35 U.S.C. 154(b) by 52 days.

(21) Appl. No.: 13/224,545

(22) Filed: Sep. 2, 2011

(30) Foreign Application Priority Data

Aug. 9, 2011 (TW) .............................. 100128341 A

(51) Int. Cl.
H05K 1/00 (2006.01)

(52) U.S. Cl. ........ 174/250; 174/262; 174/396; 361/777; 361/799; 333/161; 333/156

(58) Field of Classification Search .................. 174/396, 174/250, 255, 261, 262; 361/765, 777, 778, 361/782, 799, 800, 818; 333/161, 156
See application file for complete search history.

(56) References Cited

U.S. PATENT DOCUMENTS

| | | | | |
|---|---|---|---|---|
| 5,808,241 A | * | 9/1998 | Brooks | 174/250 |
| 7,154,049 B2 | * | 12/2006 | Celella et al. | 174/261 |
| 2006/0237222 A1 | * | 10/2006 | Hosomi et al. | 174/255 |
| 2010/0190357 A1 | * | 7/2010 | Hashim | 439/55 |

* cited by examiner

*Primary Examiner* — Hoa C Nguyen
(74) *Attorney, Agent, or Firm* — Rosenberg, Klein & Lee

(57) ABSTRACT

A delay line structure disposed on a substrate having a dielectric base layer formed with a via, a layout layer and a grounding layer with a grounding circuit, includes two parallel spiral delay lines having a first outer straight section, a first outer bent section, an inner spiral region, a second outer bent section and a second outer straight section. The inner spiral region bends reciprocally between the first and second outer straight sections to form several inner bent parts and several inner straight parts. A grounding guard trace is disposed among the first and second outer straight sections and the inner straight parts and is coupled electrically to the grounding circuit, wherein each of the first and second outer bent sections and the inner bent parts has a width smaller than each of the first and second outer straight sections and the inner straight parts.

8 Claims, 8 Drawing Sheets

DELAY LINE STRUCTURE

This application claims the benefits of the Taiwan Patent Application Serial No. 100128341 filed on Aug. 9, 2011, the subject matter of which is incorporated herein by reference.

BACKGROUND OF THE INVENTION

1. Field of the Invention

The present invention relates to a differential flat spiral delay line structure, and more particularly to a differential flat spiral delay line structure with grounding guard traces and strong coupling line parts.

2. Description of the Prior Art

Signal synchronizing is always a concern when it comes to the high speed digital signal. Usually the requirement of synchronizing signals is met by increasing the delay time with a delay line. To be more specific, for high speed signal or signal over shorter transmission circuit, a delay line structure is usually used in order to delay the transmission time.

Due to limited space in the substrate of an electronic device, the delay line is usually bent in order save the occupying space. There are various delay lines, among which a differential flat spiral delay line is very common. The following describes a differential flat spiral delay line structure of the prior art.

Referring to FIG. 1, FIG. 1 illustrates a differential flat spiral delay line structure in the prior art. A differential flat spiral delay line structure 1 is fabricated on a substrate 100, and includes two spiral delay lines 11 and 12.

To those skilled persons in the art, the prior art differential flat spiral delay line structure 1 encounters two serious problems. Firstly, crosstalk noise disturbance is generally resulted between an adjacent pair of the straight sections in the spiral delay lines, thereby affecting a waveform of a received signal, which leads to misinterpretation on a voltage level of a digital received signal. Secondly, due to unequal lengths at the outer and inner bent sections of the spiral delay lines 11 and 12, signal synchronizing for transmission the signals at the same rate is hard to achieve. Although grounding guard traces are applied to reduce the crosstalk noise disturbance, the result is still not ideal.

SUMMARY OF THE INVENTION

In the prior art technique, crosstalk noise disturbance is common at the straight sections of the spiral delay lines and there exists the different transmission speed of the signals at the bent section. The main object of the present invention is to provide a differential flat spiral line structure with grounding guard traces, wherein a width at the bent section between the spiral delay lines is reduce so as to form strong coupling effects, thereby effectively lowering noise disturbance and crosstalk effects.

The other object of the present invention is to provide a differential flat spiral delay line structure, wherein distances between the spiral delay lines consisting of the bent sections, which unequal lengths are reduced, thereby signal synchronizing for transmission the signals at the same rate.

The differential flat spiral delay line structure of the present invention is disposed on a substrate, which includes a dielectric base layer, a layout layer and a grounding layer. The dielectric base layer is formed with a plurality of vias. The layout layer and the grounding layer are spaced apart by the dielectric base layer. The grounding layer has a grounding circuit.

The differential flat spiral delay line structure accordingly includes two parallel spiral delay lines and at least one grounding guard trace. The parallel spiral delay lines are disposed in the layout layer, and include a first outer straight section, a first outer bent section, an inner spiral region, a second outer bent section and a second outer straight section.

The first outer straight section extends in a manner from an input end along a first direction to a first outer end. The first outer bent section extends in a manner from the first output end along a second direction perpendicular to the first direction and a third direction opposite to the first direction to terminate at a first inner end.

The inner spiral region is located between the first inner end and the first outer straight section, extends in a manner from the first inner end to bend reciprocally along the first and third directions adjacent to the first outer straight section and terminating at a second inner end proximate to the input end, thereby forming a plurality of inner bent parts and a plurality of inner straight parts parallel to first outer straight section.

The second outer bent section extends in a manner from the second inner end along the second direction and bends relative to the first direction and terminates at a second outer end proximate and exterior to the an inner spiral region. The second outer straight section extends in a manner from the second outer end along the first direction toward an output end.

The grounding guard trace extends through the vias in the dielectric base layer to coupled electrically to the grounding circuit of the grounding layer, and is disposed on the layout layer along the first direction at a position matching one of the following requirements: (a) proximate and exterior to the first outer straight section; (b) between the first outer straight section and the inner spiral region; (c) between the plurality of inner straight parts; (d) between the inner spiral region and the second outer straight section; and (e) proximate and exterior to the second outer straight section.

Each of the spiral delay lines consisting of the first and second outer bent sections and the plurality of inner bent parts has a width smaller than that consisting of the first and second outer straight sections and the plurality of inner straight parts.

The grounding guard trace has a first end proximate to one of the first outer bent part, the second outer bent part and the plurality of inner bent parts.

Preferably, there are several grounding guard traces and are fabricated at five different positions, wherein a distance between the spiral delay lines consisting of the first and second outer bent sections and the plurality of inner bent parts is smaller than the spiral delay lines consisting of the first and second outer straight sections and the plurality of inner straight parts.

The inner straight parts consist of a first inner straight part, a second inner straight part and a third inner straight part. The plurality of inner bent parts consists of a first inner bent part and a second inner bent part. The first inner straight part extends from the first inner end along the third direction to terminate at a third inner end. The first inner bent part extends from the third inner end along a fourth direction opposite to the second direction and bends relative to the first direction to terminate at a fourth inner end, which is located between the first outer straight section and the first inner straight section. The second inner straight part extends from the fourth inner end along the first direction to terminate at a fifth inner end. The second inner bent part extends from the fifth inner end along the fourth direction and bends relative to the third direction to terminate at a sixth inner end, which is located between the first outer straight section and the second inner straight section. The third inner straight part extends from the sixth inner end along the third direction to terminate at the second inner end.

In addition, the layout layer is disposed within the dielectric base layer or on one side of the dielectric base layer. The spiral delay lines are selected from a group consisting of microstrip lines and strip lines. The dielectric base layer consists of multiple stacked layers and is made from materials having a plurality of dielectric constants.

Concerning easy generating of crosstalk noise disturbance at the straight section and different transmission speed at the bent section of the spiral delay line in the prior art, the flat spiral delay line structure of the present invention is provided with the grounding guard trace. The present invention effectively reduces the noise disturbance, thereby enhancing the synchronize transmission of the signal due the reasons that each of the spiral delay lines has at the bent section (consisting of the first outer bent section, the second outer bent section and the inner bent parts) a width smaller the straight section (consisting of the first outer straight section, the second outer straight section and the inner straight parts).

In addition, since the width of each of the spiral delay lines is small at the bent sections when compared to the prior art ones, the difference in transmission speed is effectively reduced due to the digital signal synchronizing.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENTS

The present invention relates to a differential flat spiral delay line structure, which is widely implemented in various circuit systems for increasing a delay time in order to signal synchronizing so that the signals can be transmitted at the same time. In the following description, an embodiment is illustrated to provide a thorough understanding of the present invention, where two microstrip lines or two strip lines are used for two spiral delay lines. It will be appreciated by one skilled in the art that variations of these specific details are possible while still achieving the results of the present invention.

Figure 1:
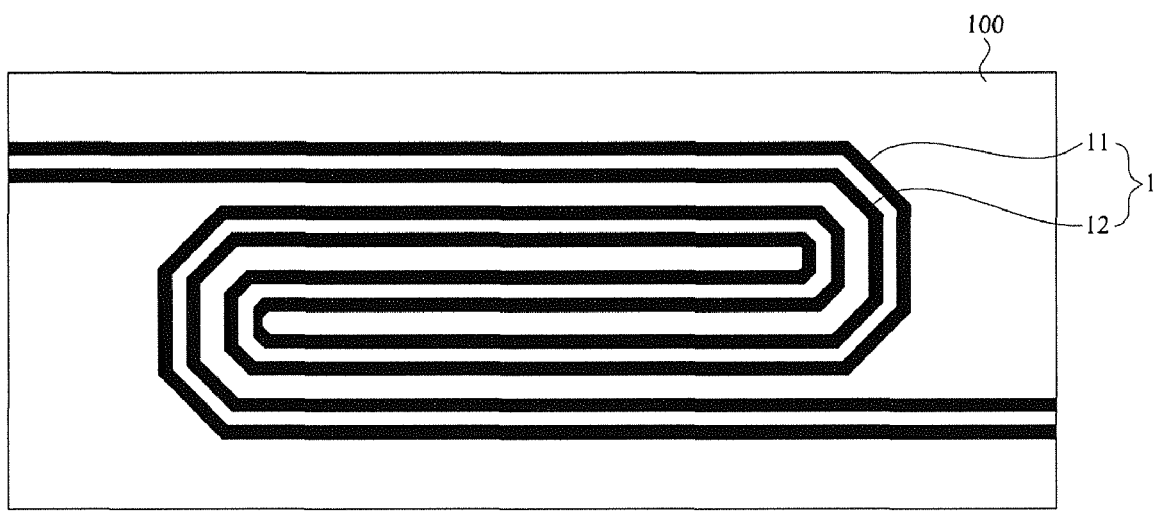
FIG. 1 illustrates a differential flat spiral delay line structure in the prior art.
Figure 2:
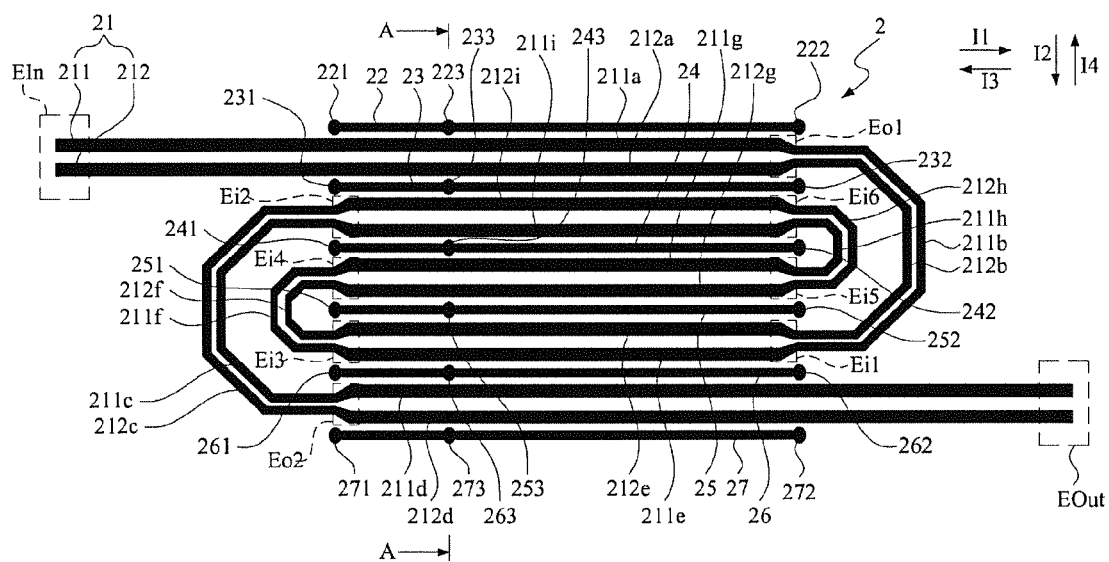
FIG. 2 illustrates an embodiment of a differential flat spiral delay line structure of the present invention disposed on a substrate.
Figure 3:
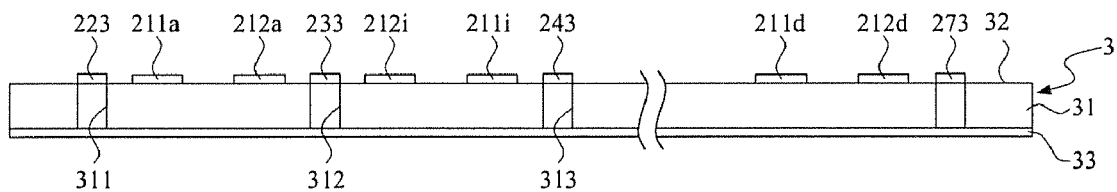
FIG. 3 illustrates a cross-sectional view of the differential flat spiral delay line structure of the present invention taken along the lines A-A in FIG. 2 when two spiral delay lines are in the faun of two microstrip lines respectively.

Referring to FIG. 2 and FIG. 3, wherein FIG. 2 illustrates an embodiment of a differential flat spiral delay line structure of the present invention disposed on a substrate while FIG. 3 illustrates a cross-sectional view of the differential flat spiral delay line structure of the present invention taken along the lines A-A in FIG. 2 when two spiral delay lines are two microstrip lines respectively. As illustrated, the differential flat spiral delay line structure 2 of the present invention is disposed on a substrate 3, and includes a spiral delay line pair 21 and at least one grounding guard trace (in this embodiment, there are six grounding guard traces 22, 23, 24, 25, 26 and 27). The spiral delay line pair 21 includes two parallel spiral delay lines 211, 212.

The parallel spiral delay lines 211, 212 and the grounding guard traces 22, 23, 24, 25, 26, 27 are fabricated on the substrate 3 when the former are in the form of microstrip lines. The substrate 3 includes a dielectric base layer 31, a layout layer 32 and a grounding layer 33. The dielectric base layer 31 consists of multiple stacked layers and is made from materials having a plurality of dielectric constants. The dielectric base layer 31 is formed with a plurality of vias (only three vias 311, 312, 313 are shown in FIG. 3). The layout layer 32 and the grounding layer 33 are spaced apart by the dielectric base layer 31. In other words, the layout layer 32 and the grounding layer 33 are disposed on two opposite sides of the dielectric base layer 31. The grounding layer 33 has a grounding circuit (not visible here).

The spiral delay line pair 21 is disposed in the layout layer 32 and includes two parallel spiral delay lines 211, 212, which has two first outer straight sections (consisting of outer straight section 211a, 112a), two first outer bent sections (consisting of outer bent section 211b, 212b), an inner spiral region, two second outer bent sections (consisting of outer bent section 211c, 212c), and two second outer straight sections (consisting of outer straight sections 211d, 212d).

Each of the first outer straight sections 211a, 112a extends in a manner from an input end EIn along a first direction I1 to a first outer end Eo1. Each of the first outer bent section 211b, 212b extends in a manner from the first output end Eo1 along a second direction I2 perpendicular to the first direction and further extends along a third direction I3 opposite to the first direction to terminate at a first inner end Ei1.

The inner spiral region is located between the first inner end Ei1 and the first outer straight section 211a, 112a, and extends in a manner from the first inner end Ei1 to bend reciprocally along the first and third directions 11, 13 adjacent to the first outer straight sections 211a, 112a and terminating at a second inner end Ei2 proximate to the input end EIn, thereby forming a plurality of inner bent parts and a plurality of inner straight parts parallel to first outer straight section 211a, 112a.

Each of the second outer bent sections 211c, 212c extends in a manner from the second inner end Ei2 along the second direction 12 and bends relative to the first direction I1 and to terminate at a second outer end Eo2 proximate and exterior to the an inner spiral region. Each of the second outer straight sections 211d, 212d extends in a manner from the second outer end Eo2 along the first direction toward an output end EOut.

In real application, the above-stated inner spiral region may be in multiple numbers. Due to reciprocally bendings of the spiral delay lines in the inner spiral regions, each inner straight part includes a first inner straight part (consisting of inner straight parts 211e, 212e), a second inner straight part (consisting of inner straight parts 211g, 212g) and a third inner straight part (consisting of inner straight parts 211i, 212i).

In the same manner, each inner bent part includes a first inner bent part (consisting of first inner bent parts 211f, 212f) and a second inner bent part (consisting of second inner bent parts 211h, 212h).

The first inner straight part (consisting of inner straight parts 211e, 212e) extends from the first inner end Ei1 along the third direction I3 to terminate at a third inner end Ei3.

The first inner bent part (consisting of first inner bent parts 211f, 212f) extends from the third inner end Ei3 along a fourth direction I4 opposite to the second direction I2 and bends relative to the first direction I1 to terminate at a fourth inner end Ei4, which is located between the first outer straight section 211a, 212a and the first inner straight section.

The second inner straight part (consisting of second inner straight parts 211g, 212g) extends from the fourth inner end Ei4 along the first direction I1 to terminate at a fifth inner end Ei5.

The second inner bent part (consisting of second inner bent parts 211h, 212h) extends from the fifth inner end Ei5 along the fourth direction I4 and bends relative to the third direction I3 to terminate at a sixth inner end Ei6, which is located between the first outer straight section and the second inner straight section.

The third inner straight part (consisting of third inner straight parts 211i, 212i) extends from the sixth inner end Ei6 along the third direction I3 to terminate at the second inner end Ei2.

The grounding guard trace 22 is disposed on the layout layer 32 and extends along the first direction at a position exterior to the first outer straight section 211a, 112a and proximate to the first and second outer bent sections (211b, 212b), (211c, 212c). The grounding guard trace 22 has several contact points 221, 222, 223 (only three are shown in FIG. 2), wherein the contact points 221, 222 are located at two opposite ends of the grounding guard trace 22 (in other words, the contact points 221, 222 respectively adjacent to the first and second outer bent sections 211b, 212b, 211c, 212c) while the contact point 223 is at between the contact points 221, 222. The contact points 221, 222, 223 of the grounding guard trace 22 are respectively aligned with the vias in the dielectric base layer 31 so as to couple electrically to the grounding circuit of the grounding layer 33, as best shown in FIG. 3.

A grounding guard trace 23 is fabricated between the first outer straight section 211a, 212a and the inner spiral region to extend along the first direction I1, and is formed with several contact points 231, 232, 233, (only three are shown in FIG. 2), wherein the contact points 231, 232 are located at two opposite ends of the grounding guard trace 23 (in other words, the contact points 231, 232 are respectively adjacent to the second outer bent sections and the second inner bent part while the contact point 233 is couple electrically to the grounding circuit of the grounding layer 33 through the via 312 in the grounding layer 33. At the same time, the contact points 231, 232 of the grounding guard trace 23 are respectively aligned with and are coupled to the grounding circuit through the respective via in the grounding layer 33.

A grounding guard trace 24 is fabricated between adjacent pair of the inner straight parts of the inner spiral region, extends along the first direction I1, and is formed with several contact points 241, 242, 243, (only three are shown in FIG. 2), wherein the contact points 241, 242 are located at two opposite ends of the grounding guard trace 24 (in other words, the contact points 241, 242 are respectively adjacent to the first inner bent part and the second inner bent part while the contact point 243 is couple electrically to the grounding circuit of the grounding layer 33 through the via 313 in the grounding layer 33. At the same time, the contact points 241, 242 of the grounding guard trace 23 are respectively aligned with and are coupled to the grounding circuit through the respective via in the grounding layer 33.

A grounding guard trace 25 is fabricated between adjacent pair of the inner straight parts of the inner spiral region, extends along the first direction I1, and is formed with several contact points 251, 252, 253, (only three are shown in FIG. 2), wherein the contact points 251, 252 are located at two opposite ends of the grounding guard trace 25 (in other words, the contact points 251, 252 are respectively adjacent to the first inner bent part and the first outer bent part. The contact points 251, 252, 253 are couple electrically to the grounding circuit of the grounding layer 33 through the respective via.

A grounding guard trace 26 is fabricated between the second outer straight section 211d, 212d and of the inner spiral region, extends along the first direction I1, and is formed with several contact points 261, 262, 263, (only three are shown in FIG. 2), wherein the contact points 261, 262 are located at two opposite ends of the grounding guard trace 26 (in other words, the contact points 261, 262 are respectively adjacent to the second inner bent part and the first outer straight section. The contact points 261, 262, 263 are couple electrically to the grounding circuit of the grounding layer 33 through the respective via.

A grounding guard trace 27 is fabricated exterior to the second outer straight section 211d, 212d, extends along the first direction I1, and is formed with several contact points 271, 272, 273, (only three are shown in FIG. 2), wherein the contact points 271, 272 are located at two opposite ends of the grounding guard trace 27 (in other words, the contact points 271, 272 are respectively adjacent to the first outer straight section and the second outer bent section. The contact points 271, 272, 273 are couple electrically to the grounding circuit of the grounding layer 33 through the respective via.

In real application, a single piece of the above-stated grounding guard traces 22, 23, 24, 25, 26, 27 is required to control the noise disturbance. However, in this embodiment all the grounding guard traces are implemented to provide effective control over the entire noise disturbance.

An important to note is that, the above stated spiral delay lines 211, 212 must match the following requirements only then the first and second outer bent sections (211b, 212b) (211c, 212c) and the above-mentioned inner bent parts will be strongly coupled so as to provide effective control of the noise disturbance via the grounding guard traces 22, 23, 24, 25, 26, 27.

The requirements are that a width of each of the first and second outer bent sections (211b, 212b), (211c, 212c) and the several inner bent parts is smaller than each of the first and second outer straight sections (211a, 212a), (211d, 212d) and the several inner straight parts.

In addition, in order to enhance signal synchronizing and strong coupling effects, a distance between the spiral delay lines 211, 212 consisting of the first and second outer bent sections (211b, 212b), (211c, 212c) and the several inner bent parts is smaller than the spiral delay lines 211, 212 consisting of the first and second outer straight sections (211b, 212b), (211c, 212c) and the several inner straight parts.

Figure 4:
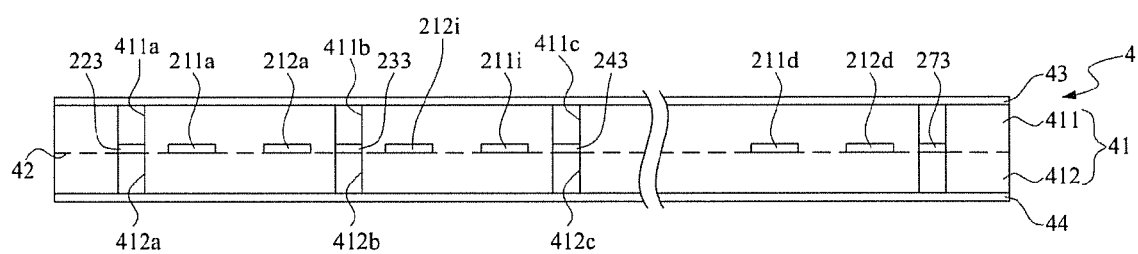
FIG. 4 illustrates a cross-sectional view of the differential flat spiral delay line structure of the present invention taken along the lines A-A in FIG. 2 when two spiral delay lines are in the form of two strip lines respectively.

Referring again to FIG. 2 and FIG. 4, wherein FIG. 4 illustrates a cross-sectional view of the differential flat spiral delay line structure of the present invention taken along the lines A-A in FIG. 2 when two spiral delay lines 211, 212 are two strip lines respectively. As illustrated in FIG. 2 and FIG. 4, when the spiral delay lines 211, 212 and the grounding guard traces 22, 23, 24, 25, 26, 27 are in the form of strip lines, they are fabricated on the substrate 4.

The substrate 4 includes a dielectric base layer 41, a layout layer 42 and two grounding layers 43, 44. The dielectric base layer 41 consists of first and second stacked dielectric base layers 411, 412 and are made from materials having a plurality of dielectric constants. The first dielectric base layer 411 is formed with a plurality of vias (only three vias 411a, 411b, 411c are shown in FIG. 3). The second dielectric base layer 412 is formed with a plurality of vias (only three vias 412a, 412b, 412c are shown in FIG. 3). The layout layer 42 is sandwiched between the first and second dielectric base layers 411, 412. In other words, the layout layer 42 is disposed within the dielectric base layer 41.

The grounding layers 43, 44 are disposed on the first and second dielectric base layers 411, 412 respectively. Hence the layout layer 42 and the grounding layers 43, 44 are spaced apart by the first and second dielectric base layers 411, 412. The grounding layers 43, 44 respectively have a grounding circuit (not visible here).

The only different in this embodiment relative to the previous embodiment is that the grounding guard traces 22, 23, 24, 25, 26, 27 are coupled electrically to the grounding circuit through the respective vias in the first and second dielectric base layers 411, 412.

As best illustrated in FIG. 4, the contact points 223, 233, 243 are coupled electrically to the grounding circuit through the vias 411a, 411b, 411c in the first dielectric base layer 411. At the same time, the contact points 223, 233, 243 are coupled electrically to the grounding circuit through the vias 412a, 412b, 412c in the second dielectric base layer 412.

When the spiral delay lines 211, 212 and the grounding guard traces 22, 23, 24, 25, 26, 27 are in the form of microstrip lines or strip lines, a noise disturbance test is carried out. According to the test, the effect of reducing the noise disturbance is more significant when the spiral delay lines 211, 212 and the grounding guard traces 22, 23, 24, 25, 26, 27 are in the form of microstrip lines than when the latter are in the or strip lines.

In order to prove reduction in the noise disturbance of the spiral delay line structure of the present invention relative to the prior art ones, several noise disturbance tests are carried out.

Figure 5:
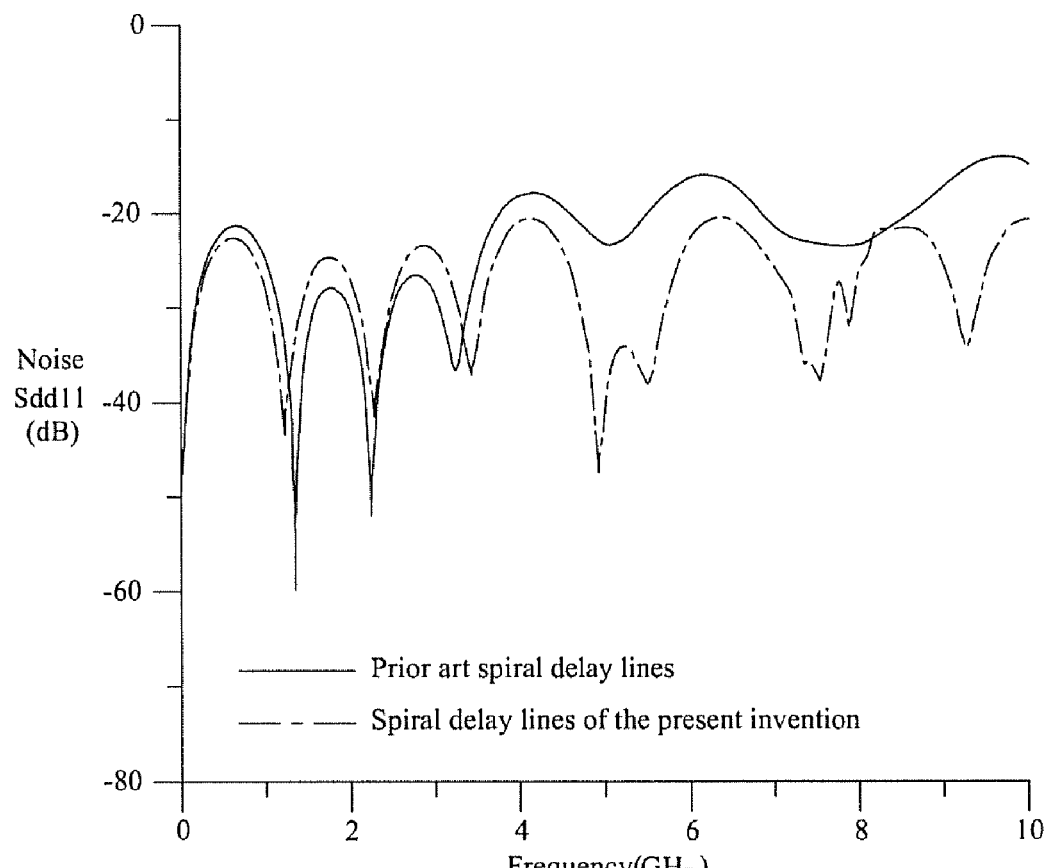
FIG. 5 is a graph showing a comparison of return loss between the differential flat spiral delay line structure of the present invention relative to the prior art.
Figure 6:
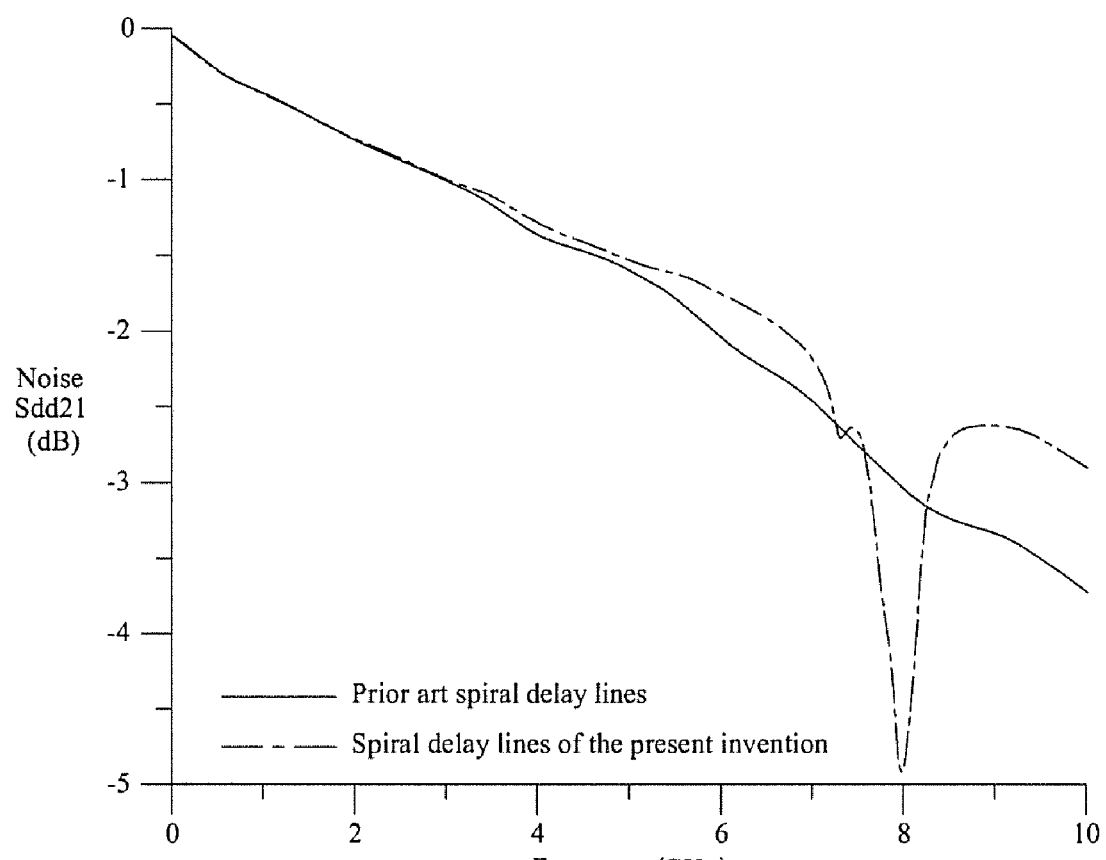
FIG. 6 is a graph showing a comparison of insertion loss between the differential flat spiral delay line structure of the present invention relative to the prior art.
Figure 7:
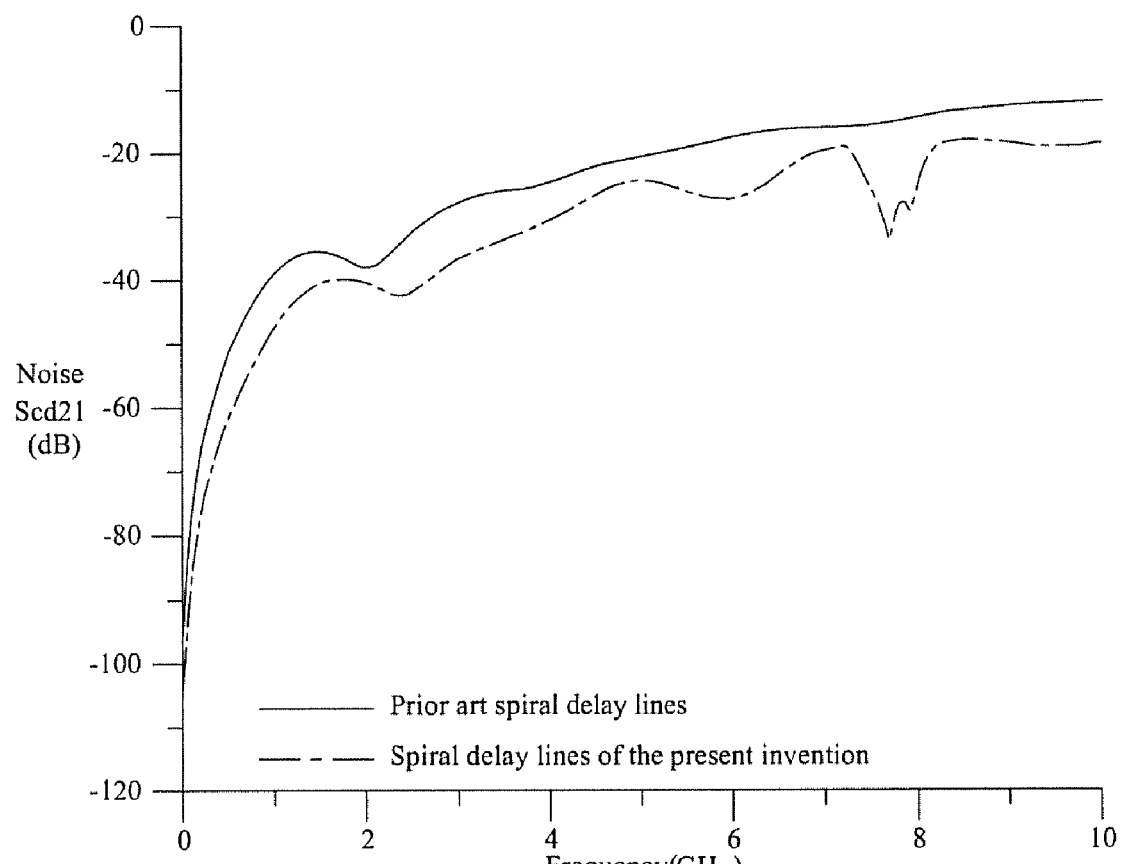
FIG. 7 is a graph showing a comparison of differential-to-common conversion between the differential flat spiral delay line structure of the present invention relative to the prior art.
Figure 8:
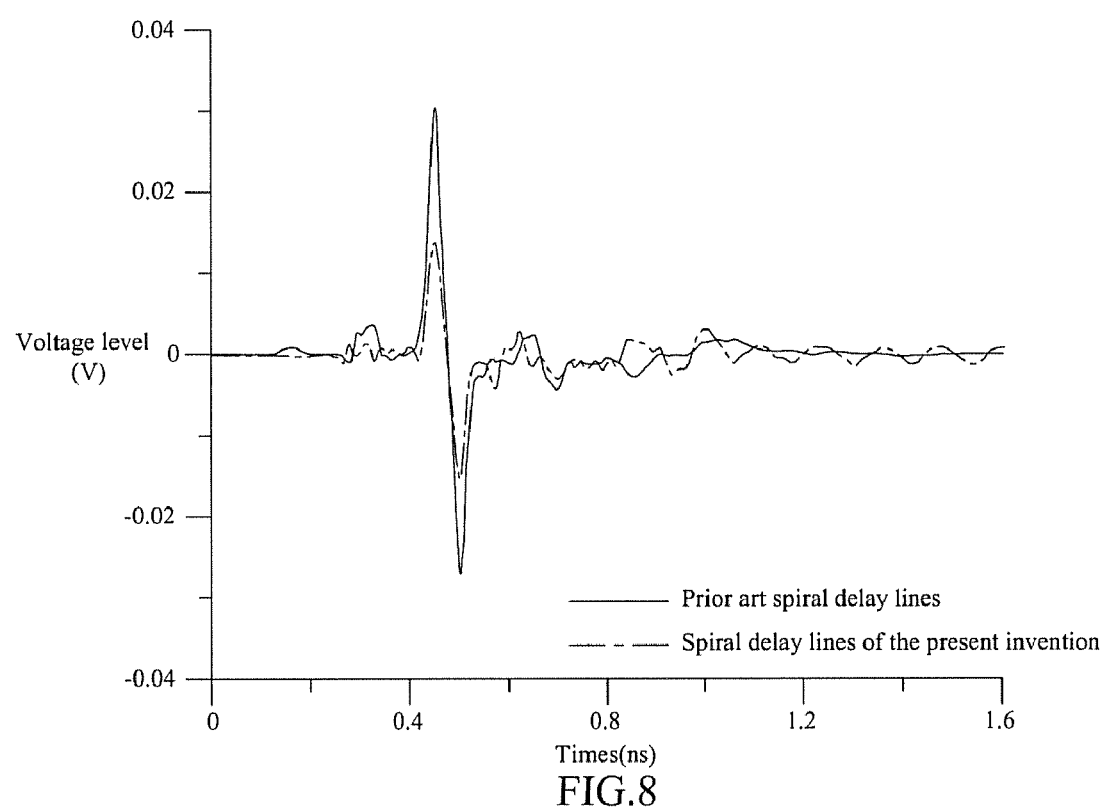
FIG. 8 is a graph showing a comparison of received signal waveform between the differential flat spiral delay line structure of the present invention relative to the prior art.

Referring to FIG. 5 to FIG. 8, FIG. 5 is a graph showing a comparison of return loss between the differential flat spiral delay line structure of the present invention relative to the prior art; FIG. 6 is a graph showing a comparison of insertion loss between the differential flat spiral delay line structure of the present invention relative to the prior art; FIG. 7 is a graph showing a comparison of differential-to-common conversion between the differential flat spiral delay line structure of the present invention relative to the prior art; and FIG. 8 is a graph showing a comparison of received signal waveform between the differential flat spiral delay line structure of the present invention relative to the prior art.

As illustrated in FIG. 5, concerning the return loss, when compared the differential flat delay line structure of the present invention relative to the prior art, it is obvious that the present invention reduces the noise disturbance more uniformly. As illustrated in FIG. 6, concerning the insert loss, noise disturbance in respective frequency is not much different from that of the prior art. As illustrated in FIG. 7, concerning the differential-to-common conversion, noise disturbance in respective frequency of the differential flat delay line structure of the present invention is more uniform than that of the prior art. As illustrated in FIG. 8, concerning the received signal waveform, different voltage level of the differential flat delay line structure of the present invention at each time interval is more stable than that of the prior art.

As described above, It is obvious that when compared with the prior art flat spiral delay line structure, the differential flat spiral delay line structure present invention reduces the noise disturbance more effectively so that the signal waveform is more ideal.

In addition, since the width between the spiral delay lines is small when compared to the prior art ones, the difference in transmission speed is effectively reduced due to the digital signal synchronizing.

While the present invention has been particularly shown and described with reference to a preferred embodiment, it will be understood by those skilled in the art that various changes in form and detail may be formed without departing from the spirit and scope of the present invention.

What is claimed is:

1. A differential flat spiral delay line structure disposed on a substrate, the substrate including a dielectric base layer, a layout layer and a grounding layer, the dielectric base layer being formed with a plurality of vias, the layout layer and the grounding layer being spaced apart by the dielectric base layer, the grounding layer having a grounding circuit, the delay line structure comprising:
   a spiral delay line pair including two parallel spiral delay lines, said spiral delay line pair being disposed in the layout layer and including
      a first outer straight section extending in a manner from an input end along a first direction to a first outer end,
      a first outer bent section extending in a manner from said first output end along a second direction perpendicular to said first direction and a third direction opposite to said first direction to terminate at a first inner end,
      an inner spiral region located between said first inner end and said first outer straight section, extending in a manner from said first inner end to bend reciprocally along said first and third directions adjacent to said first outer straight section and terminating at a second inner end proximate to said input end, thereby forming a plurality of inner bent parts and a plurality of inner straight parts parallel to first outer straight section,
      a second outer bent section extending in a manner from said second inner end along said second direction and bending relative to said first direction and terminating at a second outer end proximate and exterior to said an inner spiral region, and
      a second outer straight section extending in a manner from said second outer end along said first direction toward an output end; and
   at least one grounding guard trace extending through the vias in the dielectric base layer to couple electrically to the grounding circuit of the grounding layer, and being disposed on the layout layer along said first direction at a position matching one of the following requirements:
      (a) proximate and exterior to said first outer straight section;
      (b) between said first outer straight section and said inner spiral region;
      (c) between said plurality of inner straight parts;
      (d) between said inner spiral region and said second outer straight section; and (e) proximate and exterior to said second outer straight section;

wherein, each of said first and second outer bent sections and said plurality of inner bent parts has a width smaller than each of said first and second outer straight sections and said plurality of inner straight parts.

2. The delay line structure according to claim 1, wherein a distance between said spiral delay lines consisting of said first and second outer bent sections and said plurality of inner bent parts is smaller than said spiral delay lines consisting of said first and second outer straight sections and said plurality of inner straight parts.

3. The delay line structure according to claim 1, wherein said plurality of inner straight parts consists of a first inner straight part, a second inner straight part and a third inner straight part, said plurality of inner bent parts consisting of a first inner bent part and a second inner bent part, said first inner straight part extending from said first inner end along said third direction to terminate at a third inner end, said first inner bent part extending from said third inner end along a fourth direction opposite to said second direction and bending relative to said first direction to terminate at a fourth inner end locating between said first outer straight section and said first inner straight section, said second inner straight part extending from said fourth inner end along said first direction to terminate at a fifth inner end, said second inner bent part extending from said fifth inner end along said fourth direction and bending relative to said third direction to terminate at a sixth inner end locating between said first outer straight section and said second inner straight section, said third inner straight part extending from said sixth inner end along said third direction to terminate at said second inner end.

4. The delay line structure according to claim 1, wherein said grounding guard trace has a first end proximate to one of said first outer bent part, said second outer bent part and said plurality of inner bent parts.

5. The delay line structure according to claim 1, wherein the layout layer is disposed within the dielectric base layer.

6. The delay line structure according to claim 1, wherein the layout layer is disposed on one side of the dielectric base layer.

7. The delay line structure according to claim 1, wherein each of said spiral delay lines is selected from a group consisting of a microstrip line and a strip line.

8. The delay line structure according to claim 1, wherein the dielectric base layer consists of multiple stacked layers and is made from materials having a plurality of dielectric constants.

\* \* \* \* \*